United States Patent [19]
Ohi et al.

[11] Patent Number: 5,467,035
[45] Date of Patent: Nov. 14, 1995

[54] SAMPLE-AND-HOLD CIRCUIT

[75] Inventors: Susumu Ohi; Hiroshi Shiba, both of Tokyo, Japan

[73] Assignee: NEC Corporation, Tokyo, Japan

[21] Appl. No.: 315,716

[22] Filed: Sep. 30, 1994

Related U.S. Application Data

[63] Continuation of Ser. No. 39,796, Mar. 30, 1993.

[30] Foreign Application Priority Data

Mar. 30, 1992 [JP] Japan ..................... 4-071838

[51] Int. Cl.⁶ .................. G11C 27/02; H03K 5/00
[52] U.S. Cl. ................. 327/94; 327/95; 327/93; 327/96
[58] Field of Search ................. 327/94, 91, 93, 327/95, 96

[56] References Cited

U.S. PATENT DOCUMENTS

| | | | |
|---|---|---|---|
| 5,331,230 | 7/1994 | Ichihara | 327/94 |
| 5,381,146 | 1/1995 | Kolte | 327/94 |

*Primary Examiner*—Margaret Rose Wambach
*Attorney, Agent, or Firm*—Sughrue, Mion, Zinn, Macpeak & Seas

[57] ABSTRACT

An input terminal is connected to bases of first and second transistors. Collectors of the first and fourth transistors are connected to a power-source terminal. Collectors of the second and third transistors are grounded. A base of the third transistor is connected to an emitter of the first transistor. A base of the fourth transistor is connected to an emitter of the second transistor. One terminal of the capacitor is grounded and the other terminal thereof is connected to emitters of the third and fourth transistors and an input of an output buffer whose output is connected to an output terminal. A collector of a fifth transistor is connected to the power-source terminal and a base thereof is connected to the output terminal. A collector of a sixth transistor is grounded and a base thereof is connected to the output terminal. A first constant-current source is connected to an emitter of the fifth transistor and a base of the fourth transistor. A second constant-current source is connected to an emitter of the sixth transistor and the base of the third transistor. A third constant-current source is connected to the emitter of the first transistor and turned on at a sampling time. A fourth constant-current source is connected to the emitter of the second transistor and turned on at the sampling time.

6 Claims, 9 Drawing Sheets

5,467,035

SAMPLE-AND-HOLD CIRCUIT

This is a continuation of application Ser. No. 08/039,796 filed Mar. 30, 1993 now allowed.

BACKGROUND OF THE INVENTION

1. Field of the Invention

The present invention relates to a sample-and-hold circuit, and more particularly to a sample-and-hold circuit which can sample and hold an input signal with higher accuracy.

2. Description of the Related Art

An example of a conventional sample-and-hold circuit using a diode bridge is shown in FIG. 1.

In FIG. 1, an input terminal DIN of the sample-and-hold circuit is connected to a node N11 of the diode bridge constituted by diodes 16 to 19. A node N12 of the diode bridge is connected to an input terminal of a voltage follower 12, as well as to one terminal of a holding capacitor 11. The other terminal of the capacitor 11 is grounded. An output terminal of the voltage follower 12 serves as an output terminal DOUT of the sample-and-hold circuit.

A collector of a PNP bipolar transistor 14 (hereinafter referred to as a PNP transistor), a collector of an NPN bipolar transistor 12 (hereinafter referred to as an NPN transistor), and a node N15 of the diode bridge are connected each other. Further, a collector of a PNP transistor 15, a collector of an NPN transistor 13, and a node N16 of the diode bridge are connected each other.

An emitter of the PNP transistor 14 is connected to an emitter of the PNP transistor 15, and a constant-current source I7 is connected between these emitters and a high-power-source-voltage terminal Vcc.

An emitter of the NPN transistor 12 is connected to an emitter of PNP transistor 13, and a constant-current source I8 is connected between these emitters and a low-power-source-voltage terminal GND.

Level shifters 22 and 24 are connected between a base of the PNP transistor 14 and the NPN transistor 12. A sampling clock signal CLK is supplied to a node N13 of the level shifters 22 and 24 through an input buffer 20 and an inverter 21.

Level shifters 23 and 25 are connected between a base of the PNP transistor 15 and a base of the NPN transistor 13. The sampling clock signal CLK is supplied to a node N14 of the level shifters 22 and 24.

An operation of the sample-and-hold circuit shown in FIG. 1 will now be described, with reference to a timing chart shown in FIG. 2. When the sampling clock signal CLK shown in FIG. 2 is at high level, which indicates a sampling, the nodes N13 and N14 are at low and high levels, respectively. For this reason, the PNP transistor 14 and the NPN transistor 13 become conductive, and thus nodes N15 and N16 assume high and low levels, respectively.

The diodes 16 to 19 are forward-biased, and the nodes N11 and N12 are both clamped to the same voltage level by the diodes 16 and 17. More specifically, the voltage level of the node N12 is the same as that of an input signal supplied to the input terminal DIN, as shown in FIG. 2. The holding capacitor 11 is charged or discharged on the basis of this voltage.

When the sampling clock signal CLK is at a low level which indicates a hold, the nodes N13 and N14 assume high and low levels, respectively. The NPN transistor 12 and the PNP transistor 15 become conductive, and thus the nodes N15 and N16 assume low and high levels, respectively. As a result, the diodes 16 to 19 are reverse-biased, for which reason the input signal is isolated from the node N12. Accordingly, the voltage level of the node N12 is retained at the voltage at sampling, due to the holding capacitor 11, and output through a voltage follower 12.

In the sample-and-hold circuit shown in FIG. 1, the NPN transistor 12 and the PNP transistor 15 are saturated at the hold time. Because of this, the time (acquisition time) required for changing from a hold mode to a sample mode is prolonged. Further, at the sampling time, a current flowing into the PNP transistor 14 and the NPN transistor 13 is shunted to two paths (a path of diodes 16 and 18 and a path of diodes 17 and 19). Thus, the holding capacitor 11 cannot be charged or discharged at high speed. Further, if the current is increased in order to charge the holding capacitor 11 at high speed, the current flowing through the diodes 16 and 18 will also be increased, resulting in increased power dissipation.

Moreover, when the mode is changed from the sample mode to the hold mode, the change of voltages at the nodes N15 and N16 changes the voltage of node N12 through a coupling due to the junction capacitance of diodes 17 and 19. This phenomenon is known as "feedthrough". As shown in FIG. 2, when the mode is changed from the sample mode to the hold mode, the voltage-level change amount of each voltage level of the nodes N15 and.16 depends on the level of an input signal. As a result, the feed through differs, depending on the level of the input signal, resulting in degraded sampling accuracy.

The sample-and-hold circuit disclosed in this document is arranged as shown in FIG. 3. In the circuit shown in FIG. 3, when the clock signal CLKA is at a high level, transistors 52 and 50 are turned on and transistors 51 and 53 are turned off. Accordingly, the diodes 54 and 55 are forward-biased and diodes 56 and 57 are reverse-biased. If the forward voltage (VF) of the emitter-base junction of the transistor 50 is identical to the forward voltage of the diode 54, a voltage the same as that of the input signal VIN is applied to the hold capacitor 58. On the other hand, the hold capacitor 59 is electrically isolated from the input signal VIN, and the signal level thereof is maintained.

When clock signal CLKA is at a low level, transistors 52 and 50 are turned off and transistors 53 and 51 are turned on. As a result, diodes 54 and 55 are reverse-biased and diodes 56 and 57 are forward-biased. Accordingly, a voltage the same as that of the input signal VIN is applied to the hold capacitor 59, and hold capacitor 58 is isolated from the input signal VIN.

The sample-and-hold circuit shown in FIG. 3 eliminates the problem associated with the circuits shown in FIG. 1; i.e. the problem wherein the bias current is divided by the diode bridges and thus the charge and discharge of the hold capacitor is delayed. However, the current for charging or discharging the hold capacitors 58 and 59 is determined by the bias current IC, and the maximum charge or discharge current of the hold capacitors 58 and 59 is 2.IC/3 at most. Thus, a higher-speed charging and discharging operation requires a larger bias current, resulting in increased power consumption.

SUMMARY OF THE INVENTION

The present invention has been conceived in light of the above drawbacks and its object is to provide a high-precision sample-and-hold circuit.

Another object of the present invention is to provide a sample-and-hold circuit which can be operated at high speed with low power consumption.

In order to achieve the above object, the sample-and-hold circuit of the present invention comprises: an NPN first bipolar transistor whose collector is coupled to a high-power-source voltage terminal; a PNP second bipolar transistor whose collector is coupled to a low-power-source-voltage terminal; an input terminal coupled to bases of the first and second bipolar transistors, for receiving a signal to be sampled; a PNP third transistor whose collector is coupled to the low-power-source-voltage terminal and whose base is coupled to an emitter of the first bipolar transistor; an NPN fourth transistor whose collector is coupled to the high-power-source-voltage terminal and whose base is coupled to an emitter of the second bipolar transistor; a capacitor one terminal of which is coupled to the low-power-source-voltage terminal and the other terminal of which is coupled to emitters of the third and fourth bipolar transistors; an output buffer whose input terminal is coupled to the emitters of the third and fourth bipolar transistors; an output terminal coupled to an output terminal of the output buffer; an NPN fifth bipolar transistor whose collector is coupled to the high-power-source-voltage terminal and whose base is coupled to the output terminal; a PNP sixth bipolar transistor whose collector is coupled to the low-power-source-voltage terminal and whose base is coupled to the output terminal; a first constant-current source coupled to an emitter of the fifth bipolar transistor and to the base of the fourth bipolar transistor; a second constant-current source coupled to an emitter of the sixth bipolar transistor and the base of the third bipolar transistor; a third constant-current source coupled to the emitter of the first bipolar transistor and turned on at a sampling time; and a fourth constant-current source coupled to the emitter of the second bipolar transistor and turned on at a sampling time.

According to the sample-and-hold circuit having the above arrangement, the charging and discharging of the holding capacitor is performed by a push-pull circuit comprising the third and fourth transistors, enabling high-speed charging/discharging operations.

During a hold interval, a diode constituted by the base and emitter of the third transistor and a diode constituted by the base and emitter of the fourth transistor are reverse-biased by an amount of VF (a base-emitter forward voltage). However, the change in the base voltage of each of the third and fourth bipolar transistors is constant regardless of the level of the signal to be sampled. Accordingly, the capacitance of the base-emitter junction of the third transistor may be set at roughly same as that of the fourth transistor in order to constrain the "feedthrough" to the voltage of one terminal of the holding capacitor.

Even if the capacitance of the base-emitter junction of the third transistor differs from the capacitance of the base-emitter junction of the fourth transistor, the feedthrough will be constant, regardless of the level of the input signal. Accordingly, the sampling signal can be adjusted (corrected) easily by using a level shifter or the like. Further, if the third and fourth transistors become non-conductive, the voltage of one terminal of the holding capacitor will be completely isolated electrically from the input terminal, and therefore the influence of the feedthrough will be completely eliminated. Accordingly, a sampled voltage can be retained at its sampling level with high accuracy.

DETAILED DESCRIPTION OF THE PREFERRED EMBODIMENTS

Embodiments of the present invention will now be described, with reference to the drawings.

Figure 1:
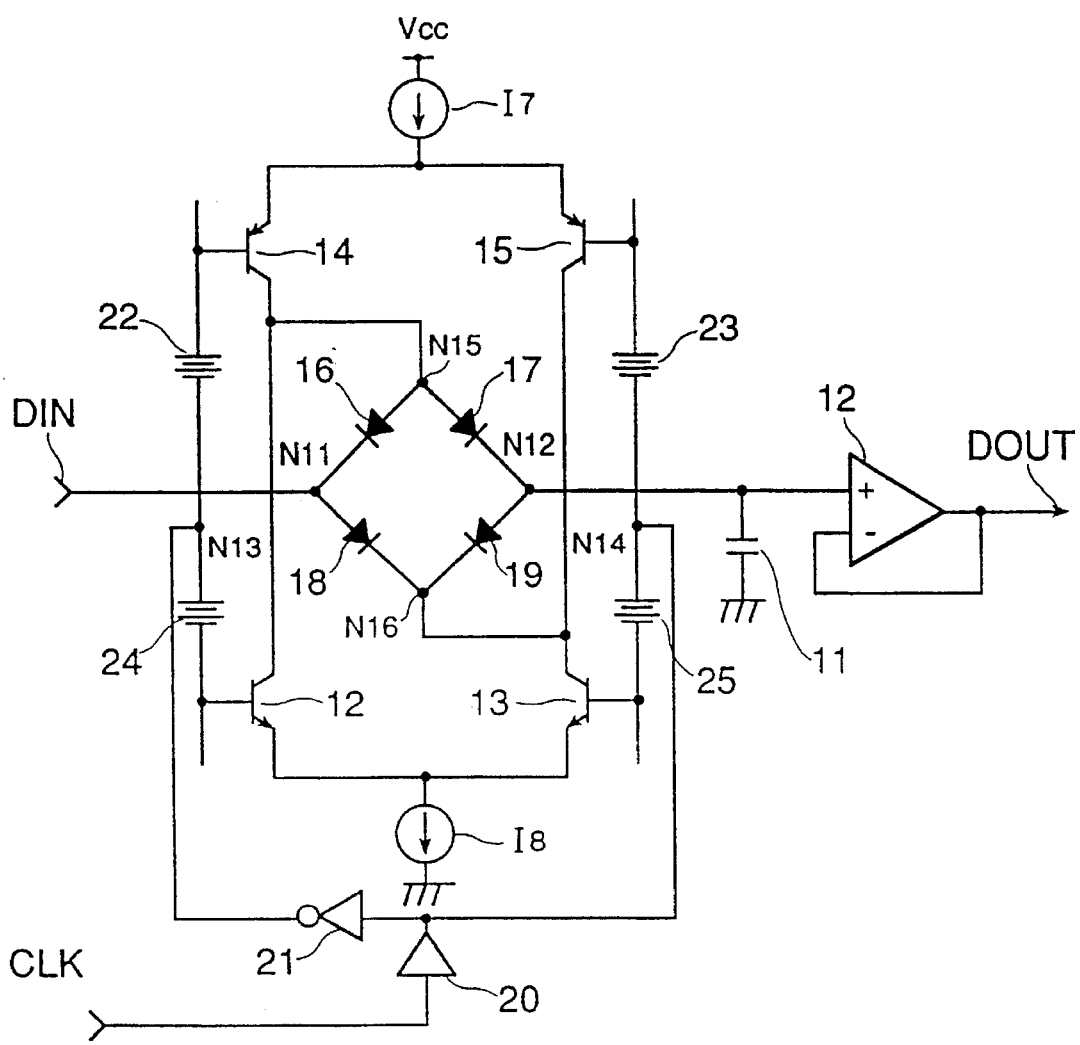
FIG. 1 is a circuit diagram of a conventional sample-and-hold circuit.
Figure 2:
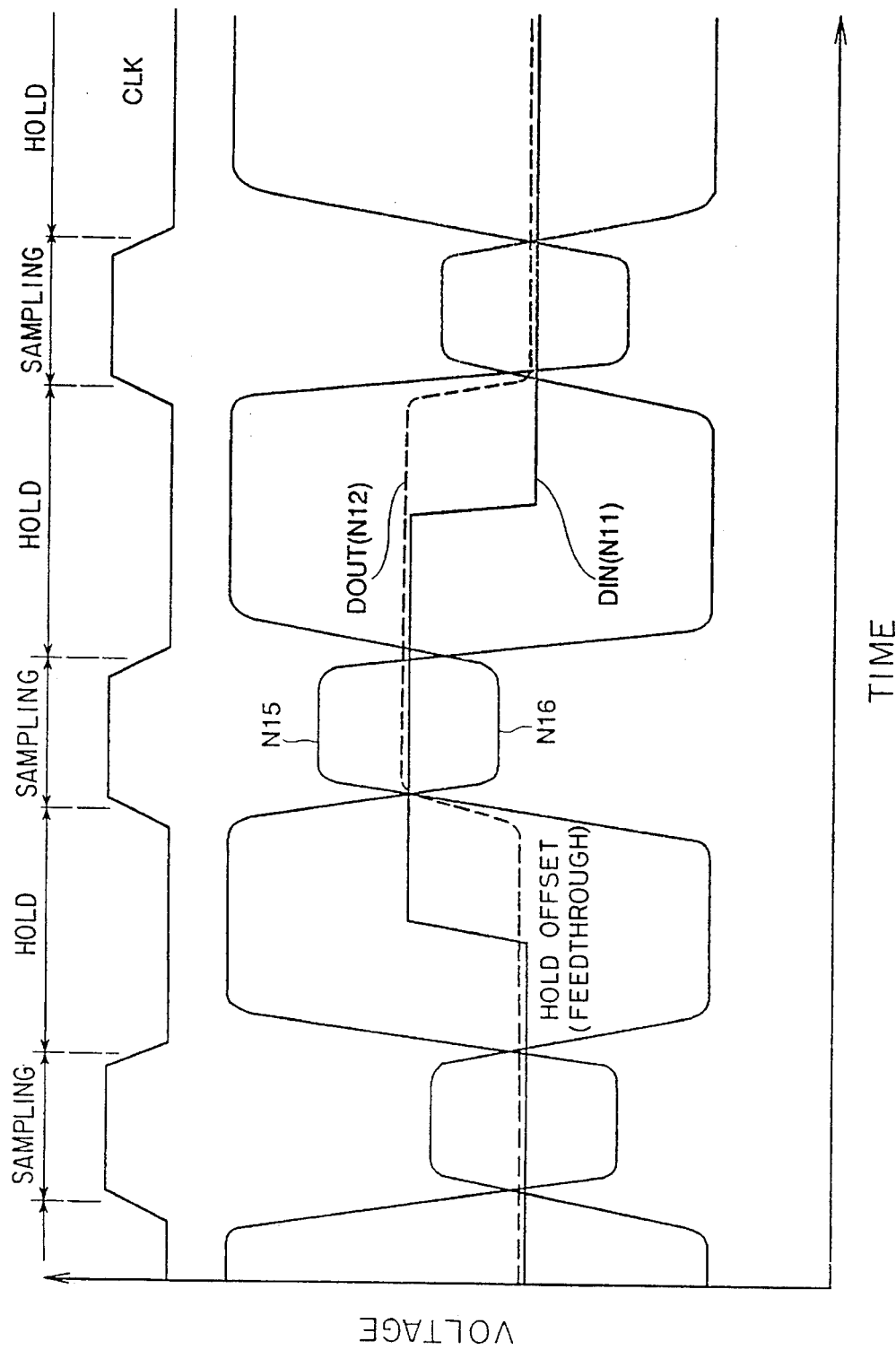
FIG. 2 is a time chart explaining an operation of the sample-and-hold circuit shown in FIG. 1.
Figure 3:
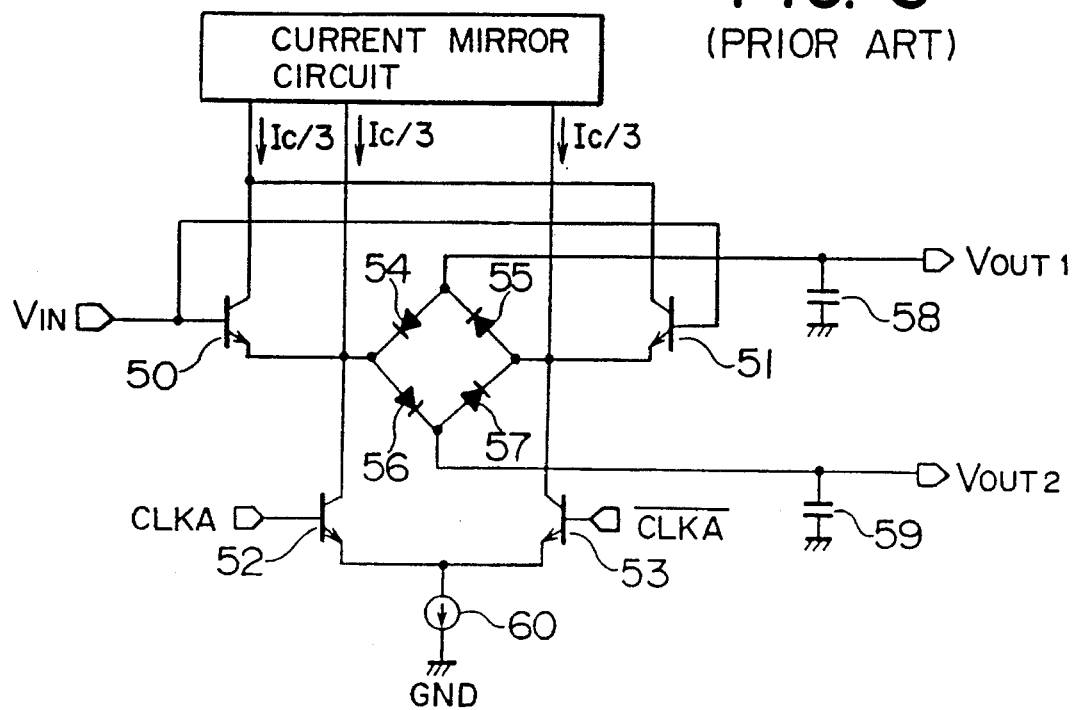
FIG. 3 is a circuit diagram showing a second example of a conventional sample-and-hold circuit.
Figure 4:
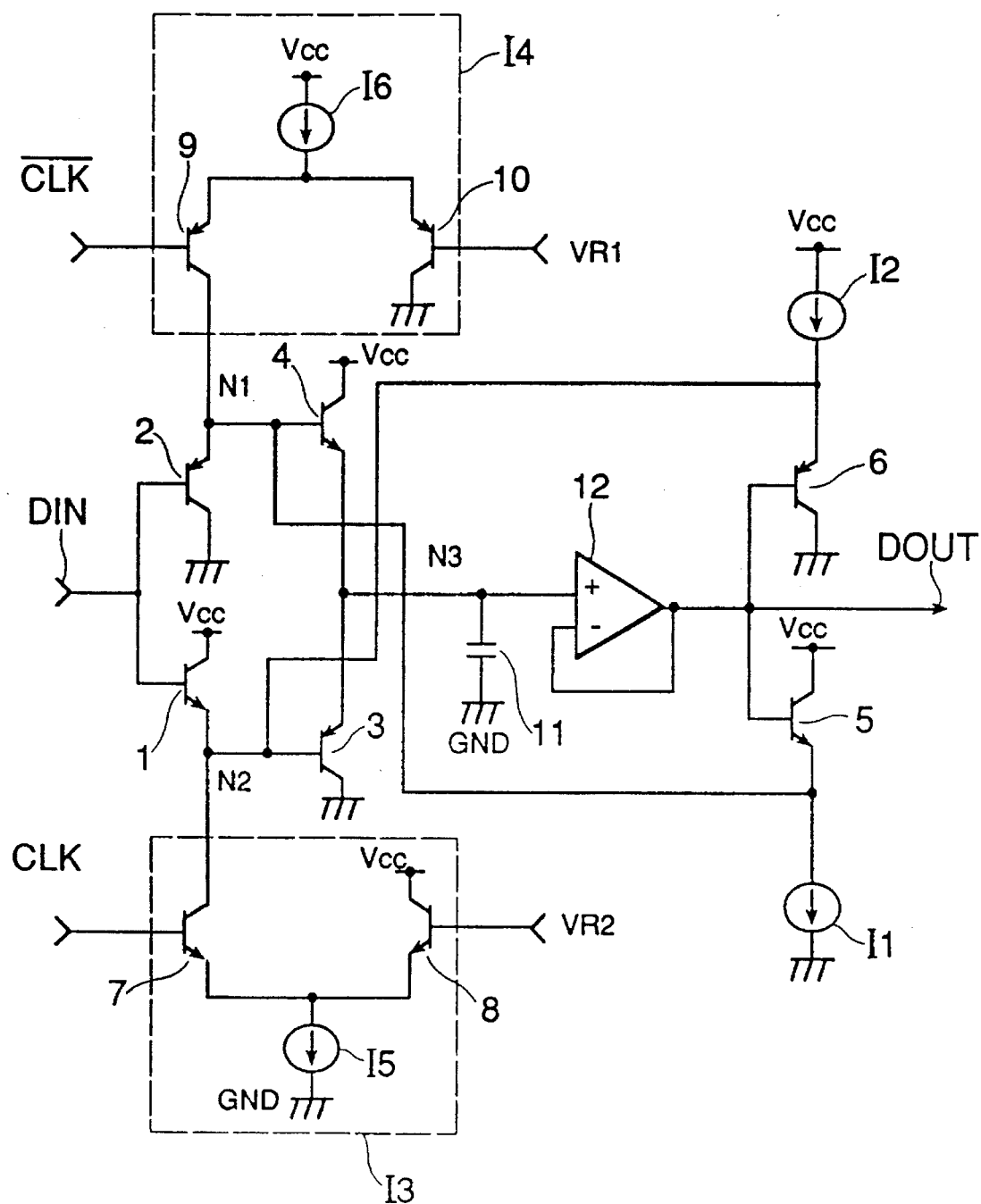
FIG. 4 is a circuit diagram of a sample-and-hold circuit according to a first embodiment of the present invention.

FIG. 4 is a circuit diagram of a sample-and-hold circuit of a first embodiment of the present invention.

As shown in FIG. 4, the input terminal DIN is connected to an NPN first transistor 1 and a PNP second transistor 2.

A collector of the first transistor 1 is connected to a high-power-source-voltage terminal Vcc. An emitter of the first transistor i is connected to a constant-current circuit I3, as well as to a base of a PNP third transistor 3. A collector of the third transistor 3 is connected to a low-power-source-voltage terminal GND.

A collector of the second transistor 2 is connected to the low-power-source-voltage terminal GND. An emitter of the second transistor 2 is connected to a constant-current circuit I4, as well as to a base of a fourth transistor 4. A collector of an NPN fourth transistor 4 is connected to the high-power-source-voltage terminal Vcc.

The emitters of the third and fourth transistors are connected to one terminal of the holding capacitor 11, as well as to an input terminal of a voltage follower 12. The emitters of the third and fourth transistors, the one terminal of the holding capacitor 11, and the input terminal of the voltage follower 12 are connected to a node N3. The other terminal of the holding capacitor 11 is connected to the low-power-source-voltage terminal GND. An output terminal of the voltage follower 12 is connected to an output terminal DOUT of the sample-and-hold circuit. Further, the output terminal of the voltage follower 12 is connected to the base of an NPN fifth transistor 5 as well as to a base of a PNP sixth transistor 6. A collector of the fifth transistor 5 is connected to the high-power-source-voltage terminal Vcc. An emitter of the fifth transistor 5 is connected to a node N1 (a node to which the emitter of the second transistor 2 and the base of the fourth transistor 4 are connected), as well as to a current input terminal of a constant-current source I1. A current output terminal of the constant-current source I1 is connected to the low-power-source-voltage terminal GND.

A collector of the sixth transistor 6 is connected to the low-power-source-voltage terminal GND. An emitter of the sixth transistor 6 is connected to a node N2 (a node to which the emitter of the first transistor 1 and the base of the third transistor 3 are connected), as well as to a current output terminal of a constant-current source I2. A current input terminal of the constant-current source I2 is connected to the high-power-source-voltage terminal Vcc.

The constant-current circuit I3 is constituted by an NPN seventh transistor 7, an NPN eighth transistor 8, and a constant-current source I5.

A sampling clock signal CLK is supplied to a base of the seventh transistor 7. A collector of the seventh transistor is connected to the node N2. A voltage VR2 whose level is between high and low levels of the sampling clock signal CLK is supplied to a base of the eighth transistor 8. A collector of the eighth transistor 8 is connected to the high-power-source-voltage terminal Vcc. The constant-current source I5 is provided between the emitters of the seventh and eighth transistors 7 and 8 and the low-power-source-voltage terminal GND.

The constant-current circuit I4 comprises a PNP ninth transistor 9 and a PNP tenth transistor 10, and a constant-current source I6.

An inverted sampling clock signal $\overline{CLK}$ is supplied to a base of the ninth transistor 9. A collector of the ninth transistor is connected to the node N1. A voltage VR1 whose level is equal to an intermediate level of the high and low levels of the inverted sampling clock signal $\overline{CLK}$ is supplied to a base of the tenth transistor 10. A collector of the tenth transistor 10 is connected to the low-power-source-voltage terminal GND. The constant-current source I6 is provided between the emitters of the ninth and tenth transistors 9 and 10 and the high-power-source-voltage terminal Vcc.

Figure 5:
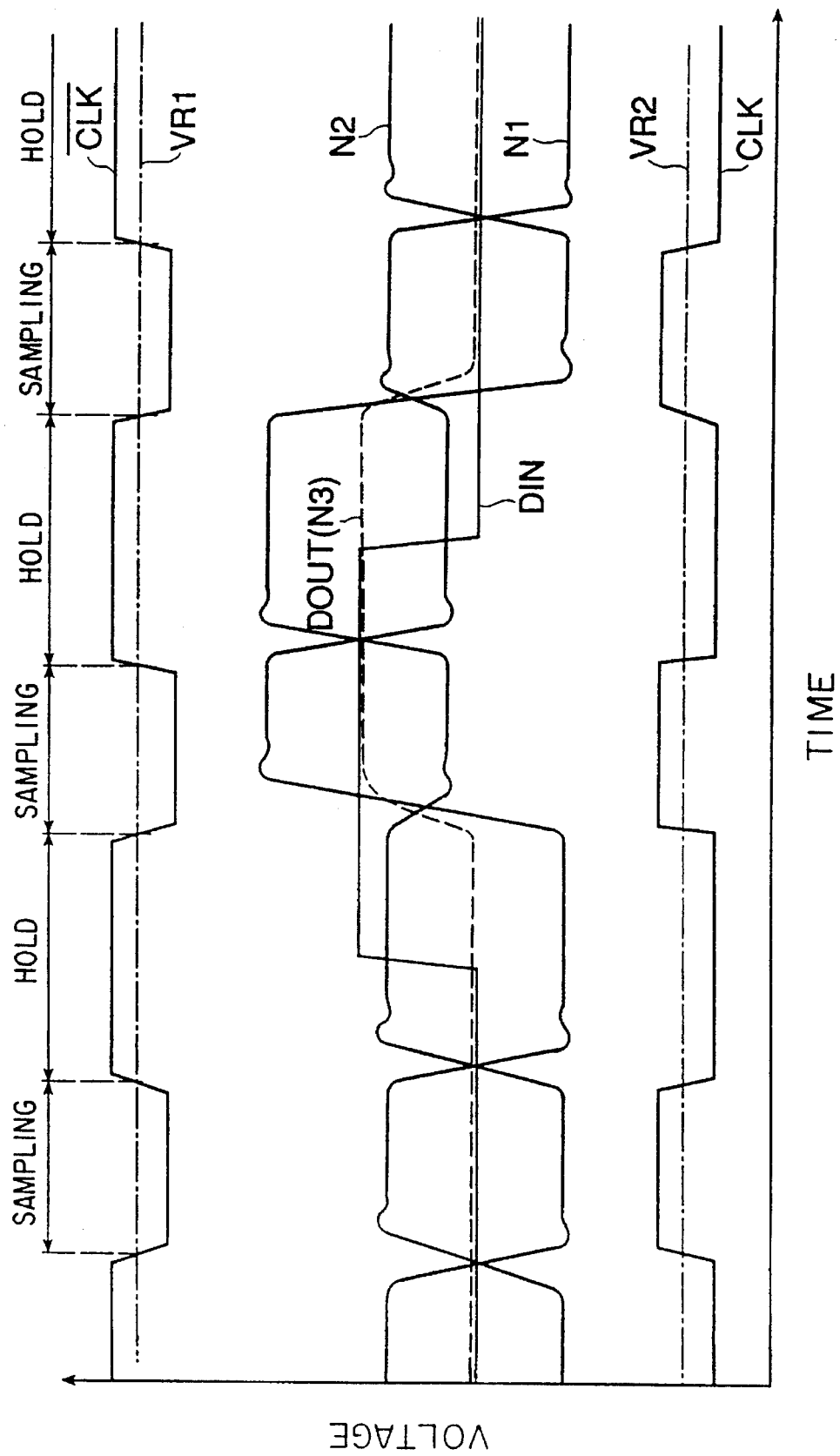
FIG. 5 is a time chart explaining an operation of the sample-and-hold circuit shown in FIG. 4.

An operation of the sample-and-hold circuit shown in FIG. 4 will now be described, with reference to FIG. 5. The inverted sampling clock signal $\overline{CLK}$ is obtained by inverting the sampling clock signal CLK and adding a predetermined bias thereto.

When the sampling clock signal CLK goes high, the inverted clock signal $\overline{CLK}$ goes low. As a result, the seventh and ninth transistors 7 and 9 are turned on. The node N2 is pulled down to a level lower than that of the input signal by the amount of a base-emitter forward voltage (hereinafter referred to as VF) of the first transistor 1, while the node N1 is pulled up to a level higher than the input signal level by the amount of the VF of the second transistor 2.

The voltage (the same as that of the output terminal DOUT) of the one terminal (node N3) of the holding capacitor 11 is clamped to a level which is lower than the voltage of the node N1 by the amount of the VF of the fourth transistor 4 and higher than the voltage of the node N2 by the amount of the VF of the third transistor 3.

Accordingly, the voltage of the node N3 (=the voltage at the output terminal DOUT) will be the same as that of the input signal if the VFs of the PNP second and third transistors 2, 3 are the same as those of the NPN fourth and first transistors 4 and 1, respectively. Accordingly, the holding capacitor 11 is charged or discharged by the current flowing into the third and fourth transistors 3 and 4 until the voltage of the node N3 reaches the input signal level.

The voltage of the node N3 is supplied to the output terminal DOUT through the voltage follower 12 and serves as the output signal of the sample-and-hold circuit. Further, the output of the voltage follower 12 is supplied to the bases of each of the fifth and sixth transistors 5 and 6.

The emitter voltage of the fifth transistor 5 (the node N1) is higher than the base voltage thereof (=the voltage at the node N3), while the emitter voltage of the sixth transistor 6 (the voltage at the node N2) is lower than the base voltage thereof (the voltage of the node N3). As a result, the fifth and sixth transistors become non-conductive.

Accordingly, the current flowing into the constant-current source I1 connected to the emitter of the fifth transistor 5 is supplied from the high-power-source-voltage terminal Vcc through the constant-current source I6 and the ninth transistor 9. The current flowing from the constant-current source I2 flows into the low-power-source-voltage terminal GND through the seventh transistor 7 and the constant-current source I5.

When the sampling clock signal CLK goes low, the seventh and ninth transistors 7 and 9 are turned off. As a result, the node N2 is electrically isolated from the constant-current source I5 and its level is raised to higher than that of the node N3 by the amount of the VF of the sixth transistor 6. The node N1 is electrically isolated from the current-constant source I6 and its level is reduced to lower than the voltage at the node N3 (=the voltage at the output terminal DOUT) by the amount of VF of the fifth transistor 5.

Accordingly, the base-emitters of the third and fourth transistors 3 and 4 are each reverse-biased, and thus the third and fourth transistors 3 and 4 are turned off. The node N3 is electrically isolated from the input terminal DIN and the voltage at the node N3 is retained at the voltage at the sampling time due to the charge stored in the holding capacitor 11. The voltage at the node N3 is output through the voltage follower 12 with high input-impedance.

As stated above, the intermediate voltage level VR1 between high and low levels of the inverted sampling clock signal $\overline{CLK}$ is applied to the base of the tenth transistor 10, and the intermediate voltage level VR2 between the high and low levels of the sampling clock signal CLK is applied to the base of the eighth transistor 8. Therefore, the eighth and tenth transistors 8 and 10 form current paths of the constant-current sources I5 and I6, respectively, when the sampling clock CLK is at a low level.

Figure 6:
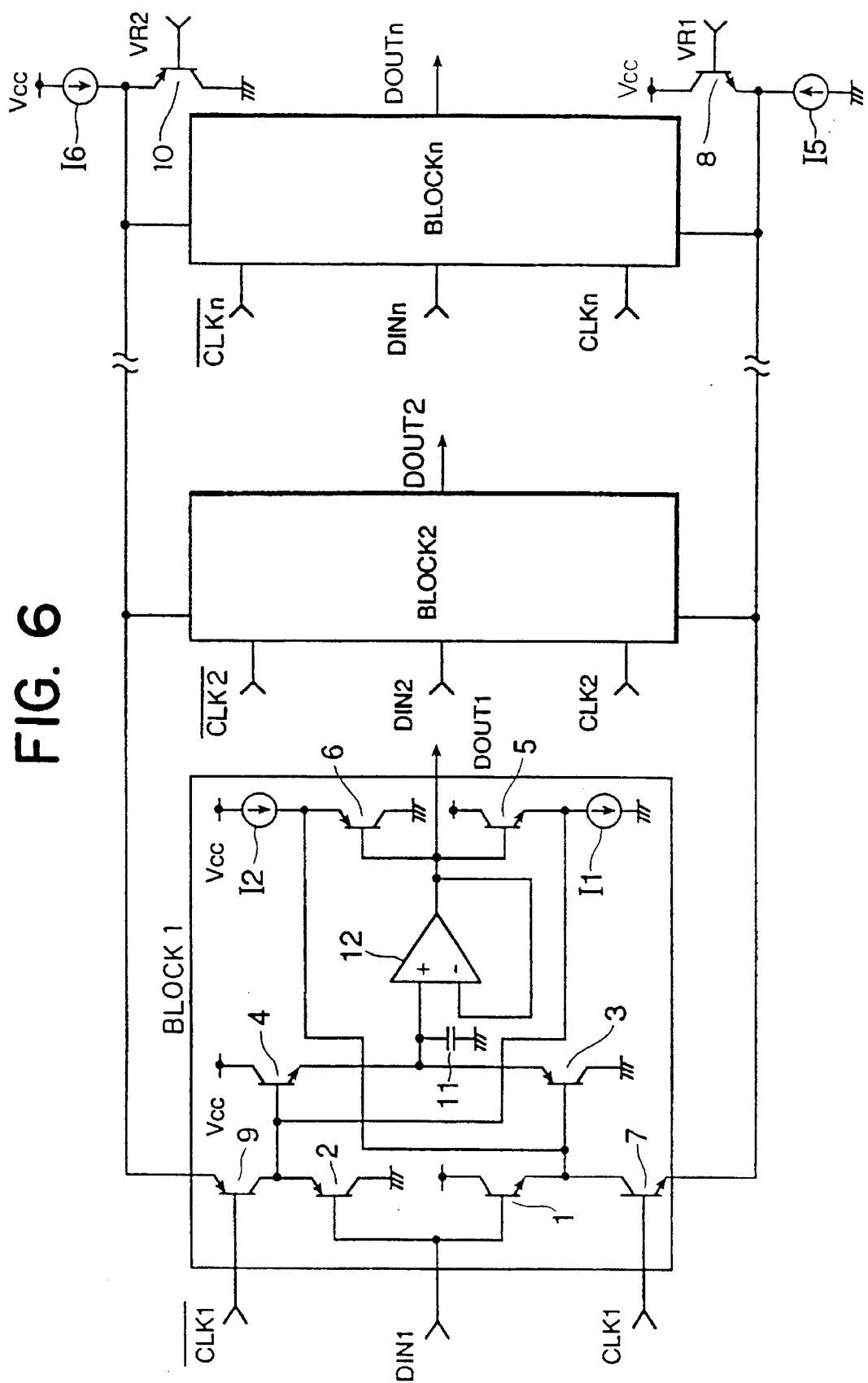
FIG. 6 is a block diagram of a sample-and-hold system according to a second embodiment of the present invention.

FIG. 6 shows a sample-and-hold system of a second embodiment of the present invention.

This system is provided with n (n is an integer more than 1) blocks. Each block comprises a sample-and-hold circuit. The constant-current source I6, the tenth transistor 10, the constant-current source I5, and the eighth transistor 8 are shared by the n sample-and-hold circuits.

The basic operation of each of the sample-and-hold circuits is the same as that of the circuit shown in FIG. 4. More specifically, a block m (1<m<n) samples a signal supplied to the input terminal DINm when a sampling clock signal CLKm (1<m<n) is at a high level. The block m holds the sampled signal and outputs the holding level from the output terminal DOUTm when the sampling clock signal CLKm (1<m<n) is at a low level.

Let it be assumed that the plurality of blocks now receive output signals from, for example, a shift register and operate sequentially. In this case, only one block is sampling. Therefore, the constant-current sources I5 and I6 can be shared by the plurality of blocks. As a result, power dissipation in the system can be reduced. This sequential operation can be performed by generating the clock signals CLK1 to CLKn from a shift register or a ring counter so that only one of the clock signals CLK1 to CLKn goes high. For example, the values from the respective registers constituting the ring counter can be used as the clock signals.

In the first embodiment of the sample-and-hold circuit, as well as the second embodiment of the sample-and-hold system, the charging and discharging of the holding capacitor 11 is performed by a push-pull circuit constituted by the third and fourth transistors 3 and 4, making possible a high-speed charging and discharging operation.

During the hold interval, the diode constituted by the base and emitter of the third transistor 3 and the diode constituted by the base and emitter of the fourth transistor 4 are reverse-biased by the amount of VF. However, the change in the voltage at each of the nodes N1 and N2 remains constant, regardless of the input signal level. Accordingly, feedthrough to the node N3 due to a voltage change at the nodes N1 and N2 can be prevented by setting the capacitance of the base-emitter junction of the third transistor 3 to be almost identical to that of the fourth transistor 4.

Even if the capacitance of the base-emitter junction of the third transistor 3 differs from that of the fourth transistor 4, the feedthrough remains unchanged, regardless of the input signal level. Accordingly, the sampling signal can be adjusted (corrected) easily by using a level shifter or the like. Further, when the third and fourth transistors 3 and 4 become non-conductive, the node N3 is completely isolated electrically from the input signal terminal DIN, and thus the influence of feedthrough can be completely eliminated. Accordingly, the sampled voltage can be retained at its sampled level with higher accuracy.

Figure 7:
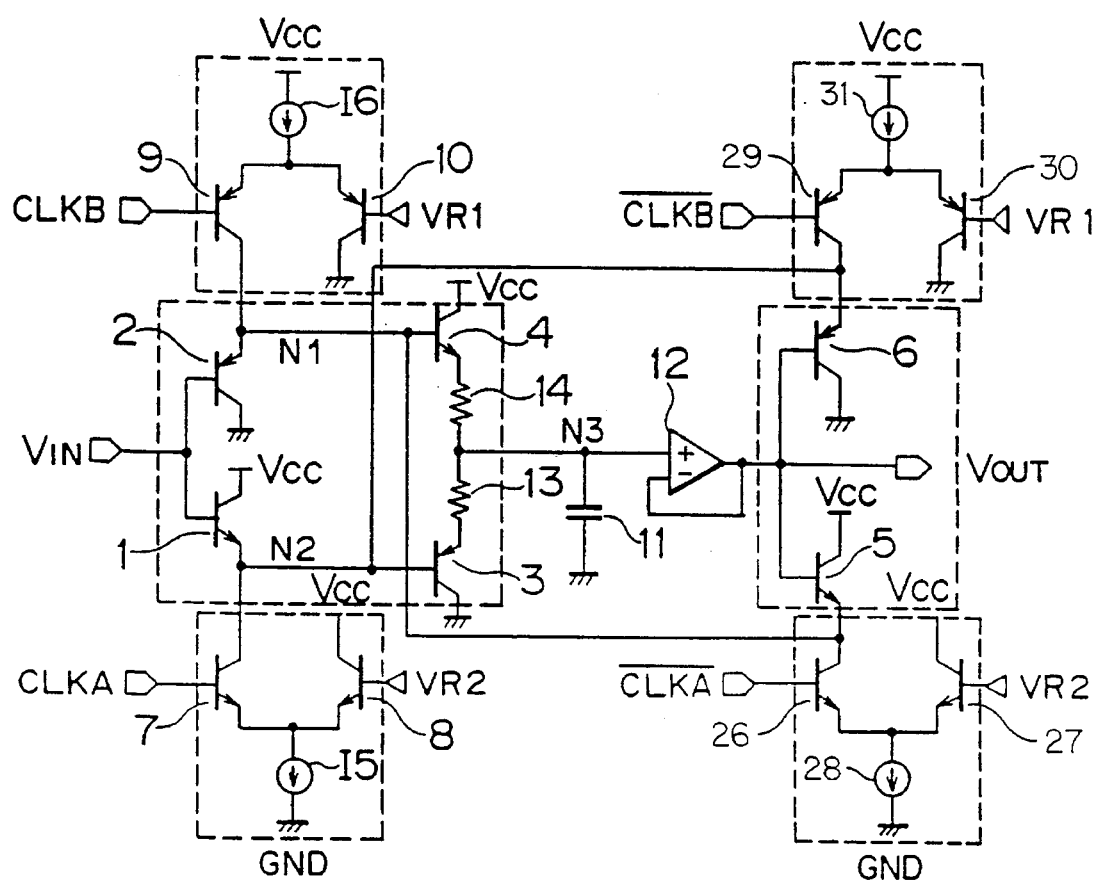
FIG. 7 is a circuit diagram showing a third embodiment of the sample-and-hold circuit according to the present invention; .

FIG. 7 is a circuit diagram showing a third embodiment of the present invention. The circuit shown in FIG. 7 is a modification of the circuit shown in FIG. 4. In the circuit shown in FIG. 7, a resistor 13 is inserted between the emitter of the transistor 3 and the node N3, and a resistor 14 is inserted between the emitter of the transistor 4 and the node N3. Further, the constant-current source I1 is substantially identical to the constant-current source I3 and is controlled by the clock signal CLKA, while the constant-current source I2 is substantially identical to the constant-current source I4 and is controlled by the clock signal CLKB.

In the circuit shown in FIG. 7, NPN transistors 1 and 4 and PNP transistors 2 and 3 constitute a current amplifier. A current switch circuit having NPN transistors 7, 8 and a constant current source I5, and a current switch circuit having PNP transistors 9, 10 and a constant-current source I6 are used as a current source of the current amplifier. An output terminal (node N3) of the current amplifier is connected to one electrode of the hold capacitor 11 and to an input terminal of a voltage follower 12.

An output of the voltage follower 12 serves as an output of the sample-and-hold circuit and is input to bases of the emitter-follower transistors 5 and 6. The emitters of the transistors 5 and 6 are connected to the bases of the transistors 4 and 3, respectively, to form feedback paths.

A current source of the feedback circuit is constituted by a current switch having transistors 26, 27 and a constant-current source 28, and a current switch having transistors 29, 30 and a constant-current source 31.

The clock signal CLKA is at high and low levels during sampling and hold intervals, respectively. A voltage VR2 is a constant voltage of an intermediate level between the high and low levels of the clock signal CLKA. The clock signal $\overline{CLKA}$ is an inverted signal of the clock signal CLKA. The clock signal $\overline{CLKB}$ is at low and high levels during sample and hold intervals, respectively. A voltage VR1 is a constant voltage of an intermediate level between the high and low levels of the clock signal CLKB. The clock signal CLKB is an inverted signal of the clock signal CLKB.

Figure 8:
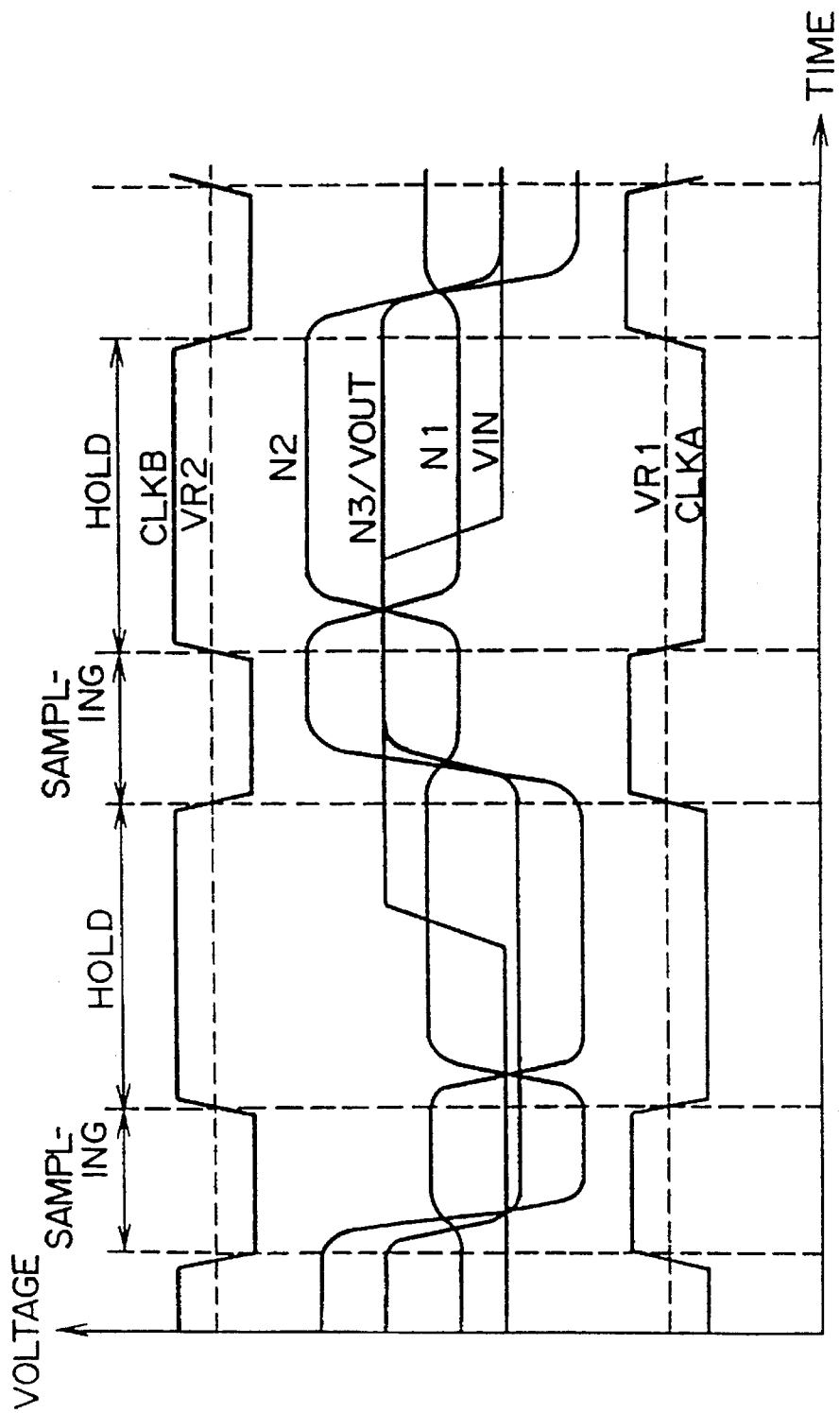
FIG. 8 is a timing chart explaining the operation o the sample-and-hold circuit shown in FIG. 7.

An operation of the sample-and-hold circuit shown in FIG. 7 will now be described, with reference to the timing chart shown in FIG. 8.

During the sampling interval, the clock signals CLKA and CLKB are at high and low levels, respectively. The transistors 7 and 9, and the transistors 8 and 10 in the current switches are turned on and off, respectively. Accordingly, the currents from the constant-current sources I5 and I6 flow through the transistors 7 and 9, respectively, to operate the current amplifier. Assume now that the base-emitter voltages VF of the transistors 1, 2, 3, and 4 constituting the current amplifier are identical to each other and the voltage of the input signal is VIN. In this case, the voltages of the nodes N1 and N2 will be VIN+VF and VIN-VF, respectively, and the voltage of the node N3 will be VIN. The resistors 13 and 14 serve to reduce the DC feedthrough currents flowing through the transistors 3 and 4, caused by variation in the VF and oscillations during the transient interval. A push-pull circuit comprising the transistors 3 and 4 can charge and discharge the hold capacitor 11 at high speed. The voltage of the hold capacitor 11 is output through the voltage follower 12.

Further, in the current source for the feedback circuit, the transistors 26 and 29 are turned on and the transistors 27 and 30 are turned off, with the result that no current flows through the transistors 5 and 6. Accordingly, the emitter-base junctions of the transistors 5 and 6 are reverse-biased and the potentials of the nodes N1 and N2 are not affected by the feedback circuit.

During the hold interval, the transistors 7 and 9 are turned off and the transistors 8 and 10 are turned on. Accordingly, the currents from the current sources I5 and I6 flow through the transistors 8 and 10, respectively. As a result, the current amplifier does not operate and the input terminal is electrically isolated from the hold capacitor 11. Further, the transistors 26 and 29 are turned on, and the transistors 27 and 30 are turned off. As a result, a current flows through the transistors 5 and 6. The transistors 5 and 6 serve as emitter followers and the voltages of the emitters of the transistors 5 and 6 become VN3−VF and VN3+VF, respectively, where VN3 represents a voltage of the node N3. Accordingly, VN1=VN3−VF and VN2=VN3+VF are satisfied where VN1 and VN2 represent voltages of nodes N1 and N2, respectively. As a result, the emitter-base junctions of the transistors 3 and 4 are reverse-biased, thereby eliminating the influence of data through.

In the first embodiment, shown in FIG. 4, the current values of the constant-current sources I1 and I2 have to be large in order to shorten the hold mode setting time. However, when the current values of the constant-current sources I1 and I2 are large, the currents from the current sources I5 and I6 are divided into the currents from the current sources I1 and I2. Therefore, the currents supplied from the current sources I5 and I6 to the transistors 3 and 4 are reduced, resulting in a prolonged acquisition period. However, in the third embodiment, shown in FIG. 7, the currents from the current sources 28 and 31 flow through the transistors 27 and 30 during the sampling interval, so that the currents from the current sources I5 and I6 are not divided. As a result, the high-speed hold operation and the high-speed sampling operation can be independently controlled, resulting in improved performance of the sample-and-hold circuit.

Figure 9:
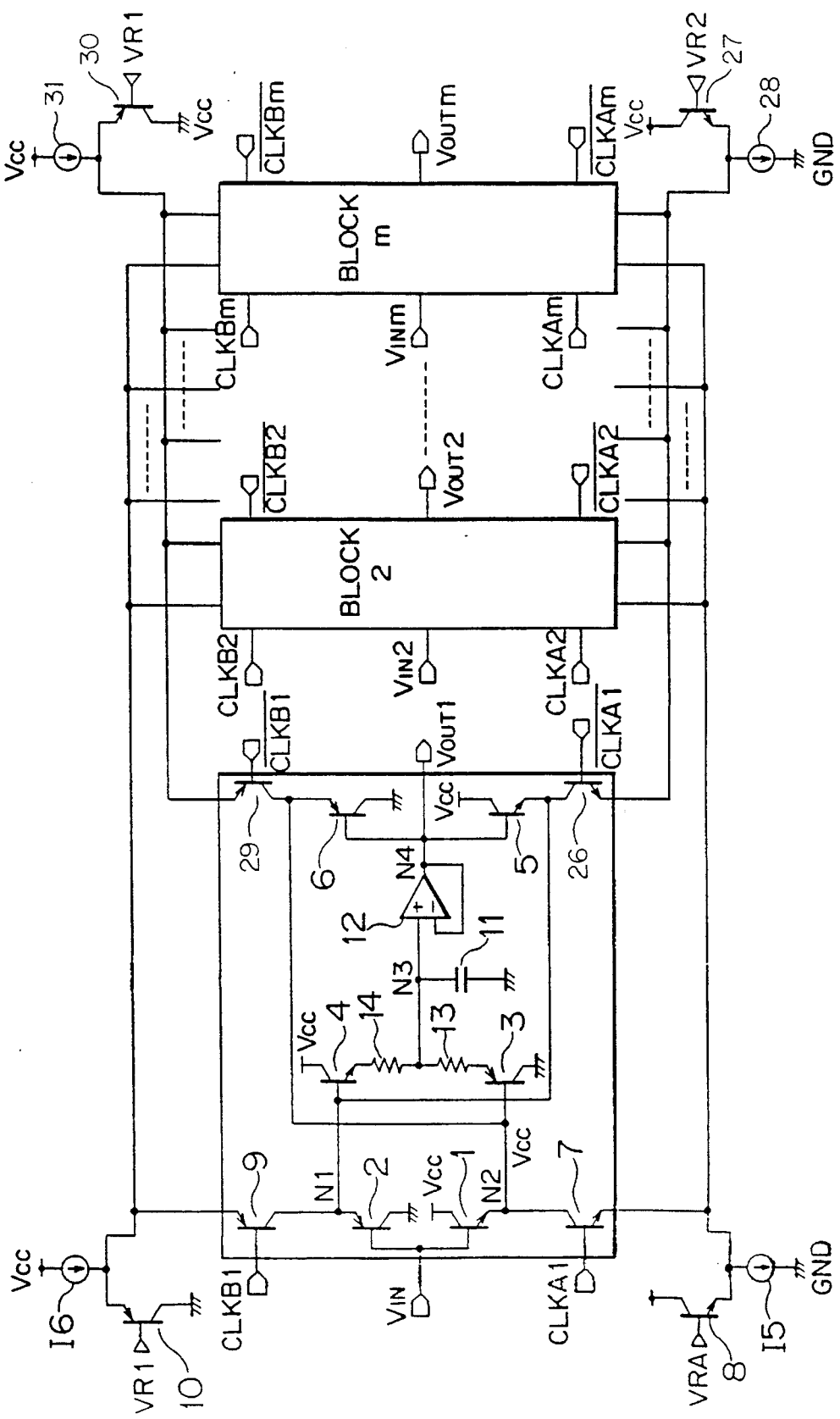
FIG. 9 is a circuit diagram showing a fourth embodiment of the sample-and-hold circuit according to the present invention.

FIG. 9 shows a fourth embodiment of the present invention. The circuit of this embodiment includes a plurality of sample-and-hold circuits of the third embodiment. This circuit continuously and sequentially samples data in accordance with an output of, for example, a shift register or the like. In this embodiment, a plurality of sample-and-hold circuits share the current sources I5, I6, 28, and 31, as well as the reference-side transistors 8, 10, 27, and 30 of the current switches. According to this embodiment, the circuit size and the current amount can be reduced, compared to a case where each sample-and-hold circuit is provided with its own current source.

The present invention is not limited to the above embodiments. For example, in the embodiments described, the sample-and-hold circuit is constituted by bipolar transistors. However, they may be constituted by other elements such as MOSFETs. In this case, the PNP transistors and NPN transistors are replaced by P-channel MOSFETs and N-channel MOSFETs, respectively. A threshold voltage of each of the MOSFETs is adequately adjusted. However, if the sample-and-hold circuit is fully constituted by the MOSFETs, it will operate at a slow speed. Therefore, only the seventh to tenth transistors 7 to 10 are preferably constituted by MOSFETs.

Further, in the above embodiment, the voltage follower 12 is used as the output buffer. Other output buffer may also be used in place of the voltage follower 12. Further, a voltage other than the power source voltage (e.g., a raised or reduced power source voltage) may be applied to the high-power-source-voltage terminal Vcc. Furthermore, a voltage other than a ground voltage may be applied to the low-power-source-voltage terminal GND.

What is claimed is:

1. A sample-and-hold circuit, comprising:

a capacitor;

a push-pull circuit directly connected to the capacitor for charging and discharging the capacitor;

control means for receiving a sample signal to be sampled and a sampling clock signal, for controlling the push-pull circuit so that a voltage at a connection point of the push-pull circuit and the capacitor is equal to a voltage of the sample signal when the sampling clock signal indicates a sampling, and for turning off the push-pull circuit to isolate the capacitor from the sample signal when the sampling clock signal indicates a hold; and an output buffer coupled to the capacitor for outputting a hold voltage of the capacitor.

2. The sample-and-hold circuit according to claim 1, wherein the push-pull circuit comprises:

a first switching element having a current path coupled to a first power-source terminal at one end and coupled to the capacitor at the other end; and a second switching element having a current path coupled to a second power source terminal at one end and coupled to the capacitor and the other end of the current path of the first switching element at the other end.

3. The sample-and-hold circuit according to claim 2, wherein the control means includes means for rendering a voltage at a connection point of the first and second switching elements to be identical to a voltage of the sample signal when the sampling clock signal indicates the sampling and for turning off the first and second switching elements when the sampling clock signal indicates the hold.

4. A sample-and-hold circuit, comprising:

a capacitor;

a push-pull circuit directly connected to the capacitor without an intervention of any diode for charging and discharging the capacitor;

control means for receiving a sample signal to be sampled and a sampling clock signal, for controlling the push-pull circuit so that a voltage at a connection point of the push-pull circuit and the capacitor is equal to a voltage of the sample signal when the sampling clock signal indicates a sampling, and for turning off the push-pull circuit to isolate the capacitor from the sample signal when the sampling clock signal indicates a hold; and an output buffer coupled to the capacitor for outputting a hold voltage of the capacitor.

5. The sample-and-hold circuit according to claim 5, wherein the push-pull circuit comprises:

a first switching element having a current path coupled to a first power-source terminal at one end and coupled to the capacitor at the other end; and a second switching element having a current path coupled to a second power source terminal at one end and coupled to the capacitor and the other end of the current path of the first switching element at the other end.

6. The sample-and-hold circuit according to claim 5, wherein the control means includes means for rendering a voltage at a connection point of the first and second switching elements to be identical to a voltage of the sample signal when the sampling clock signal indicates the sampling and for turning off the first and second switching elements when the sampling clock signal indicates the hold.

* * * * *

UNITED STATES PATENT AND TRADEMARK OFFICE
CERTIFICATE OF CORRECTION

PATENT NO.   : 5,467,035
DATED        : November 14, 1995
INVENTOR(S)  : Susumu OHI, Hiroshi SHIBA It is certified that error(s) appears in the above-identified patent and that said Letters Patent is hereby corrected as shown below:

Col. 4, line 15, delete "o", insert --of--.

Col. 4, line 33, delete "i", insert --1--.

Signed and Sealed this

Twenty-fifth Day of June, 1996

Attest:

BRUCE LEHMAN

*Attesting Officer*        *Commissioner of Patents and Trademarks*